United States Patent [19]

Haga et al.

[11] Patent Number: 5,717,255
[45] Date of Patent: Feb. 10, 1998

[54] SEMICONDUCTOR DEVICE

[75] Inventors: Takahiro Haga; Yoshinori Kaido; Takayoshi Yasuda, all of Hyogo, Japan

[73] Assignee: Sanyo Electric Co., Ltd., Osaka, Japan

[21] Appl. No.: 386,232

[22] Filed: Feb. 9, 1995

[30] Foreign Application Priority Data

Feb. 17, 1994 [JP] Japan .................. 6-020401

[51] Int. Cl.$^6$ ............... H01L 23/48; H01L 23/52; H01L 29/40
[52] U.S. Cl. .............. 257/781; 257/753; 257/762; 257/737; 257/673
[58] Field of Search ................... 257/753, 762, 257/786, 781, 737, 673

[56] References Cited

U.S. PATENT DOCUMENTS

| | | | |
|---|---|---|---|
| 3,868,724 | 2/1975 | Perrino | 257/673 |
| 4,290,079 | 9/1981 | Carpenter et al. | 257/762 |
| 4,486,945 | 12/1984 | Aigoo | 29/588 |
| 4,521,476 | 6/1985 | Asai et al. | 428/209 |
| 4,733,289 | 3/1988 | Tsurumaru | 257/753 |
| 4,974,057 | 11/1990 | Tazima | 257/693 |
| 5,083,187 | 1/1992 | Lamson et al. | 257/762 |
| 5,107,325 | 4/1992 | Nakayoshi | 257/793 |
| 5,133,810 | 7/1992 | Morizane et al. | 136/251 |
| 5,438,222 | 8/1995 | Yamazaki | 257/673 |

FOREIGN PATENT DOCUMENTS

| | | | |
|---|---|---|---|
| 554019 | 8/1993 | European Pat. Off. | 257/673 |
| 62-281376 | 12/1987 | Japan . | |
| 64-13740 | 1/1989 | Japan . | |

*Primary Examiner*—Mahshid D. Saadat
*Assistant Examiner*—T. M. Arroyo
*Attorney, Agent, or Firm*—Loeb & Loeb LLP

[57] ABSTRACT

A semiconductor device has a semiconductor element, an output terminal coupled to the semiconductor element and a thin metal member or foil secured to an output terminal. A protective layer covers the semiconductor element including the periphery of the metal foil to define an opening located at the metal foil. By covering the periphery of the metal foil, the protective layer secures the metal foil to the semiconductor element. A lead element is affixed to the metal foil by soldering through the opening. The resulting structure increases the adhesion of the lead element. Furthermore, because the protective film covers and seals the periphery of the metal foil, the advance of moisture into the inside of the semiconductor device is retarded. Accordingly the moisture resistance of the semiconductor device is improved.

14 Claims, 9 Drawing Sheets es,717,255

SEMICONDUCTOR DEVICE

FIELD OF THE INVENTION

The present invention relates generally to a semiconductor device and a method of manufacturing thereof, and more particularly to the structure of an output terminal region in the semiconductor device and a method of manufacturing such a structure.

Background of the Invention

Japanese Utility Model Laid-open No. SHO 64-13740 describes a semiconductor device in which each lead element is secured to a copper-containing pad in each output terminal region. The copper-containing pad enables the lead element to be strongly affixed to the pad by conventional soldering. The copper-containing pad is formed by screen-printing a copper paste which is then hardened by the application of heat.

FIG. 1 shows a photovoltaic apparatus output terminal structures which include copper-containing pads. In each output terminal region, the output terminal structure comprises, in order, an insulating substrate 210, a conductive belt 220, a metal layer 230, an amorphous silicon layer 240, a transparent conductive layer 250, an output terminal 260, a copper-containing pad 270 and a lead element 280.

The insulating substrate 210 is generally rectangular and is often made of polyimide and the like. The conductive belt 220 is disposed along one side edge of the insulating substrate 210, and is formed by screen-printing a metal paste onto the substrate and, then hardening the metal paste by heating. The output terminal 260 is of generally the same shape and the same material as the conductive belt 220 and is formed on the transparent conductive layer 250. The copper-containing pad 270 is generally rectangular, and is formed on and around one edge of the output terminal 260. The lead element 280 is made of a metal strip and is soldered to the copper-containing pad 270.

When the lead element 280 is pulled, the lead element 280 can inadvertently be readily removed as shown in FIG. 2. Because the adhesion between the insulating substrate 210 made of polyimide and the conductive belt 220 is generally weak, they will often separate easily.

On the other hand, even if the metal layer 230 is directly formed on the insulating substrate 210 without the conductive belt 220, the adhesion between the insulating substrate 210 and the metal layer 230 is also generally weak. Therefore, when the lead element 280 is pulled, the lead element 280 can still be easily removed.

U.S. Pat. No. 5,133,810 describes another output terminal structure of a photovoltaic apparatus having an output terminal. In the output terminal structure, a lead element is connected to the output terminal, and a protective film is formed on the photovoltaic apparatus including the output terminal.

FIG. 3 shows another output terminal structure. It is noted that the same numerals represent corresponding elements shown in FIG. 1, and the explanation concerning these corresponding elements is omitted. In each such output terminal structure, a protective film 290 covers the output terminal region including a lead element 280. In such output terminal structures, because the protective film 290 covers the lead element 280, it is more difficult to inadvertently separate the lead element 280 from the terminal structure. However, spaces 300 are often formed at both sides along the lead element 280. As a result, moisture can advance into the interior of the photovoltaic apparatus through the spaces 300. Consequently, corrosion can occur, decreasing long term reliability.

There are other disadvantages. For example, the above described output terminal structure is not readily adapted to fabrication processes in which a plurality of photovoltaic apparatuses are divided from one large substrate. More specifically, if each of the lead elements of the output terminals of a plurality of photovoltaic apparatuses were covered with one protective film formed over the entire surface of all the photovoltaic apparatuses of the substrate, while one end portion of the lead element of each of the output terminals could be connected to the appropriate output terminal, the opposite end portion of the lead element might be located undesirably over another photovoltaic apparatus under the protective film.

SUMMARY OF THE INVENTION

It is an object of the present invention to provide a semiconductor device having an improved output terminal region and a method of manufacturing the same in which both the adhesion of the lead element and the resistance to moisture are improved.

These and other objects are achieved by a semiconductor device, in accordance with one embodiment of the present invention, having a semiconductor element, an output terminal coupled to the semiconductor element, a metal foil secured to the output terminal, and a protective layer which covers the semiconductor element including the periphery of the metal foil and defines an opening located at the metal foil. By covering the periphery of the metal foil, the protective layer allows the metal foil to be strongly affixed to the semiconductor element. Further, a lead element may be strongly secured to the metal foil through the opening in the protective layer. Furthermore, since the protective film covers and seals the periphery of the metal foil, moisture intrusion into the interior of the semiconductor device is substantially reduced or eliminated. As a result, moisture resistance is improved.

DETAILED DESCRIPTION OF THE PREFERRED EMBODIMENTS

A first embodiment of the present invention will be described with reference to FIGS. 4–8. As will be explained in greater detail below, the semiconductor device of the illustrated embodiment includes a protective film which covers a semiconductor element including the periphery of a metal foil secured on an output terminal. The protective film defines an opening located on the metal foil. By covering the periphery of the metal foil, the protective layer strongly secures the metal foil to the semiconductor element. In addition, a lead element may be secured to the metal foil through the opening. As a result, the lead element resists inadvertent separation. In addition, moisture resistance is also improved by the protective film which covers and seals the periphery of the metal foil.

Figure 4:
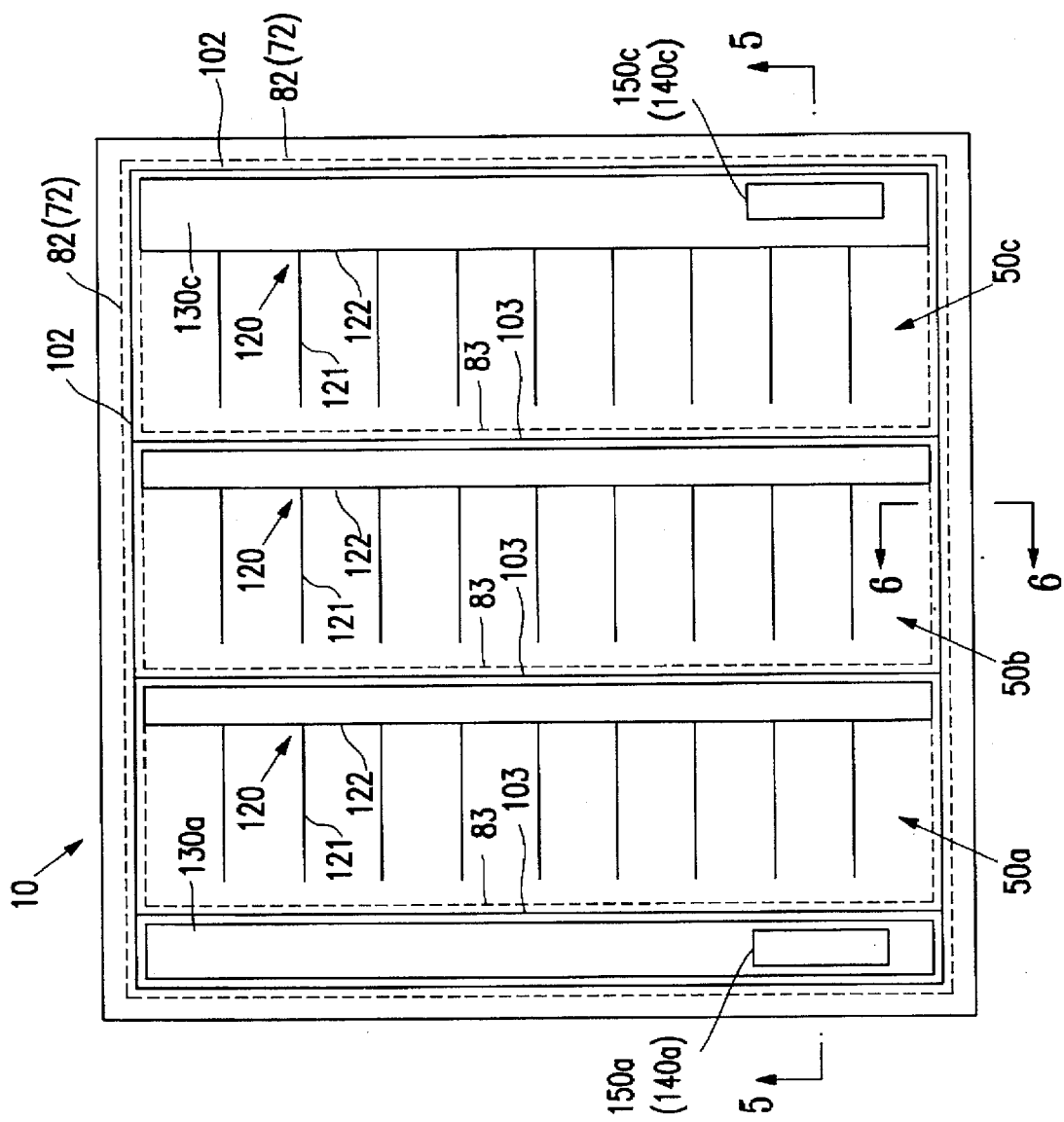
FIG. 4 is a plan view of a semiconductor device in accordance with a first embodiment of the present invention, at an intermediate fabrication step.
Figure 5:
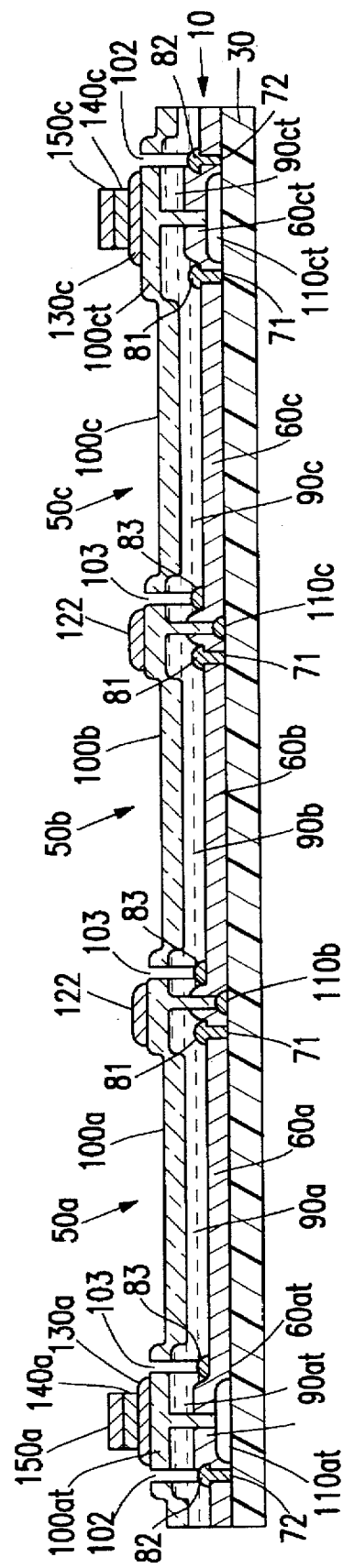
FIG. 5 is a cross-sectional view of the device of FIG. 4 taken along the line 5—5 of FIG. 4.
Figure 6:
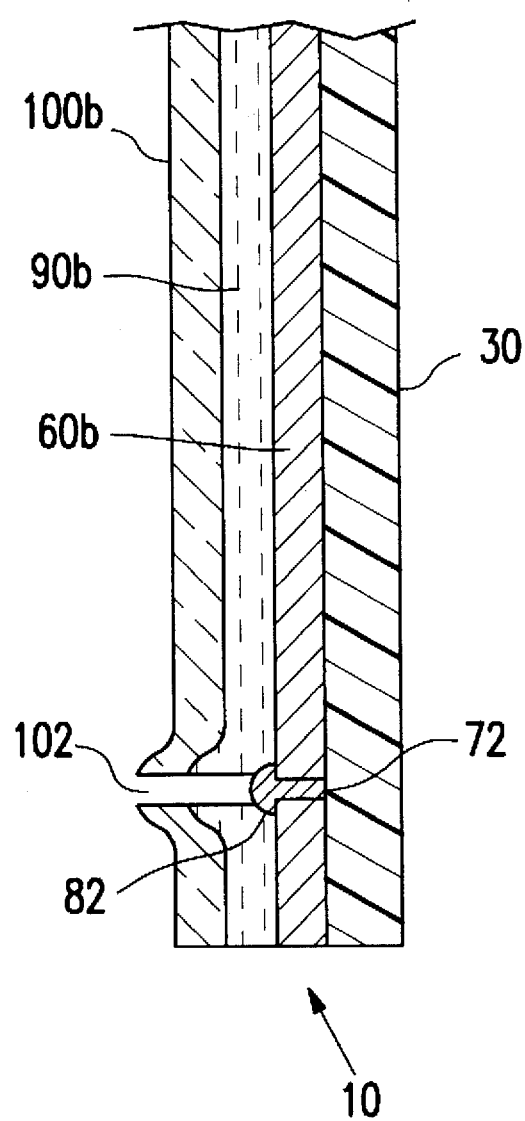
FIG. 6 is a cross-sectional view of the device of FIG. 4 taken along the line 6—6 of FIG. 4.

FIGS. 4–6 show a structure in accordance with a preferred embodiment of the present invention at an intermediate step of the fabrication process of the semiconductor device. In this embodiment, the semiconductor device is a photovoltaic apparatus and comprises a semiconductor element 10 and a substrate 30. The substrate 30 may comprise a flexible metal sheet made of a suitable material, such as, for example, stainless steel and aluminum, and an insulating resin made of polyimide or the like formed on the flexible metal sheet. The substrate 30 may also be made of a film made of polyimide or the like.

In the semiconductor element 10, a plurality of photovoltaic regions 50a–50c are formed on the substrate 30. As shown in FIG. 5, first electrodes 60a–60c are disposed in each of the photovoltaic regions 50a–50c on the substrate 30, respectively. The first electrodes 60a–60c are preferably approximately 0.1–1.0 μm thick and each comprise either a single layer or a stacked layer. The single layer may be made of a suitable material, such as, for example, aluminum, titanium, nickel or copper. The stacked layer may also be made of suitable materials such as, for example, aluminum/titanium layers disposed in this order on the substrate 30, or tungsten/aluminum/titanium layers disposed in this order on the substrate 30.

The first electrodes 60a–60c are preferably formed in the following manner. A metal layer for the first electrodes 60a–60c is formed on the entire surface of the substrate 30. A laser beam is directed onto the metal layer to remove the metal at predetermined surface portions. In this manner, dividing grooves 71(preferably about 50 μm in width) between the photovoltaic regions 50a–50c and on the right edge of the photovoltaic region 50c, and a peripheral groove 72 (again, preferably about 50 μm in width) in the vicinity of the periphery of the substrate 30, are formed.

Insulating bars 81 are provided to fill in the dividing grooves 71. Each insulating bar 81 extends laterally at its top portion over the metal layers in both sides of each of the dividing grooves 71. An insulating bar 82 is filled in the peripheral groove 72. The top portion of the insulating bar 82 extends laterally over the metal layers on both sides of the peripheral groove 72. The insulating bars 81, 82 adhere more strongly to the surface insulating resin, of the substrate 30 than do the first electrodes made of metal layers. As a result, the insulating bars 81, 82 prevent the first electrodes from being inadvertently removed from the substrate 30. Insulating bars 83 are each formed on each of the first electrodes 60a–60c along the left edge of each of the first electrodes 60a–60c.

The insulating bars 81, 82 and 83 are formed by screen-printing an insulating paste, then hardening the insulating paste at a temperature of 250°–300° C. For example, each of the insulating bars 81, 82 and 83 is preferably 10–50 μm in height and 0.4–0.6 mm in width. The insulating paste comprises a powder of insulating material and a paste-like binder. The powder of the insulating material is made of a suitable material, such as, for example, silicon dioxide (about 1.5–7.0 μm in particle dimension). The binder is made of a suitable material, such as, for example, polyimide or phenol.

Semiconductor photovoltaic layers 90a–90c are disposed on the first electrodes 60a–60c, respectively. The semiconductor photovoltaic layers 90a–90c have the thickness of about 0.3–1.0 μm and comprise for example a PIN or PN junction which may be made of, for example, amorphous silicon, amorphous silicon carbide, amorphous silicon germanium.

Second electrodes 100a–100c are disposed on the semiconductor photovoltaic layers 90a–90c, respectively. The second electrodes 100a–100c comprise a transparent conductive film which is preferably about 0.3–1.0 μm thick and formed of a suitable material such as tin oxide, zinc oxide or indium tin oxide.

The semiconductor photo-active layers 90a–90c and the second electrodes 100a–100c are preferably formed in the following manner. A continuous semiconductor photo-active layer for the semiconductor photo-active layers 90a–90c is formed on the entire surface of the substrate to cover the first electrodes 60a–60c. Thereafter a continuous transparent conductive oxide film for the second electrodes 100a–100c is formed over the continuous semiconductor photo-active layer. Then, a laser beam is directed to the insulating bars 82 and 83 so that portions of both semiconductor active layer and transparent conductive oxide film over the insulating bars 82 and 83 are removed to form dividing grooves 102 and 103. The dividing grooves 102 and 103 define the semiconductor photo-active layers 90a–90c and the second electrodes 100a–100c, respectively.

Conductive bars 110b, 110c are located between the first electrodes 60b, 60c and the substrate 30, at the left edge of the first electrodes 60b, 60c, respectively, in order to electrically connect the first electrode of one photovoltaic region to the second electrode in the adjacent photovoltaic region. Electric connection between the first electrodes and the second electrodes is accomplished in the following manner. A laser beam is directed over the conductive bars 110b, 110c, to melt portions of both the second electrodes 100a, 100b and the semiconductor photo-active layers 90a, 90b over the conductive bars 110b, 110c, so that second electrodes 100a, 100b contact the conducive bars 110b, 110c respectively. Therefore the photovoltaic regions 50a–50c are connected in series.

The conductive bars 110b, 110c are preferably formed by screen-printing a metal paste, then hardening the metal paste at a temperature ranging between 250°–300° C. In one embodiment, the conductive bars 110b, 110c are 10–50 μm in height and 0.4–0.6 mm in width. The metal paste comprises a powder of metal material and a paste-like binder. The powder of metal material is made of a suitable material, such as, for example, silver, nickel or aluminum (preferably about 3–7 μm in particle dimension). The binder is made of a suitable material, such as, for example, polyimide or phenol.

Referring to FIG. 4, collecting electrodes 120 each comprise a plurality of branch portions 121 and a bar-shaped trunk portion 122. The branch portions 121 extend within each of the photovoltaic regions 50a–50c in the direction in which the photovoltaic regions 50a–50c are arranged. The branch portions 121 are connected to each trunk portion 122 at the right edges thereof. The trunk portions 122 are located over the conductive bars 110b, 110c, respectively as best shown in FIG. 5. In the collecting electrode 120 at the right end, an output terminal 130c which will be explained below is used as a trunk portion.

A feature of the invention in an improved output terminal region which will be explained in detail below. As shown in FIG. 5, the output terminal region may be located at the left edge on the substrate 30. The output terminal region of the illustrated embodiment comprises a conductive belt 110at, a first electrode extending portion 60at, a semiconductor pad 90at, and a second electrode pad 100at. The extending portion 60at extends from the first electrode 60a. The conductive belt 110at is located between the extending portion 60at and the substrate 30, extending along the left side of the substrate 30. The conductive belt 110at is made of the similar materials as the conductive bar 110b, 110c, and is formed in a similar process as the conductor bars 110b, 110c. The semiconductor pad 90at is formed on the conductive belt 110at in the same process as the above-mentioned semiconductor photo-active layer, and is made of the same material as the above-mentioned semiconductor photo-active layer. The second electrode pad 100at is formed on the semiconductor pad 90at in a similar shape as the semiconductor pad 90at, and in the same process as the second electrode. The second electrode pad 100at is made of the same material as the second electrode. To electrically connect the conductive belt 110at and the second electrode pad 100at, a laser beam is directed thereon to melt the conductive belt 110at and the second electrode pad 100at. As a result, the second electrode pad 100at contacts and is electrically connected to the conductive belt 110at.

An output terminal 130a is formed by screen-printing a metal paste which is subsequently hardened by heating. The output terminal 130a extends along the left side of the substrate 30 on the second electrode pad 100at. A generally rectangular copper-containing pad 140a is located on one end of the output terminal 130a. The pad 140a may be formed by screen-printing a copper paste and, then hardening the copper paste. The copper paste comprises a powder of copper and a paste-like binder. The powder of copper is preferably about 5–7 µm in particle dimension and about 90 wt %. The binder is made of a suitable material, such as, for example, phenol. The copper-containing pad 140a facilitates soldering a lead element thereon using ordinary soldering methods.

A metal foil 150a having a rectangular sheet shape is secured to the copper-containing pad 140a. The metal foil 150a is made of copper and the entire surface thereof is covered with solder plating. The metal foil 150a is secured to the pad 140a in the following manner. Soldering flux is first spread over the copper-containing pad 140a. Then the metal foil 150a is placed on the copper-containing pad 140a. Heat is subsequently applied through the metal foil by means of, for example, soldering iron. As a result, the solder plating melts which secures the metal foil 150a to the copper-containing pad 140a.

When the metal foil 150a (preferably about 50–3000 µm, more preferably about 80 µm in thickness) is covered with solder plating, the metal foil 150a may be secured to the pad with only this thin solder plating (preferably about 2 µm in thickness) thereby eliminating the need for a solder layer (about 100–1000 µm in thickness). As a result, the total thickness of the output terminal region can become substantially thin. On the other hand, when the metal foil 150a is not covered with solder plating, the metal foil 150a can be secured by a solder layer(about 100–1000 µm in thickness) between the metal foil 150a and the copper-containing pad 140a, resulting in an output terminal region which is somewhat more thick. In yet another alternative, to secure the foil and pad more strongly, the metal foil 150a covered with solder plating may be also secured by a solder layer between the metal foil 150a and the copper-containing pad 140a.

In a similar manner, the output terminal region located at the right edge on the substrate 30 comprises a conductive belt 110ct, a first electrode pad 60ct, a semiconductor pad 90ct, and a second electrode extending portion 100ct. The first electrode pad 60ct is disposed next to the right side of the photovoltaic region 50c on the substrate 30. The first electrode pad 60ct may be formed in the same process as the first electrode, and be made of the same material as the first electrode. The conductive belt 110ct is located between the first electrode pad 60ct and the substrate 30, and extends along the right side of the substrate 30. The conductive belt 110ct is made of a similar material as the conductive bar 110b, 110c, and may be formed in a similar process as the conductor bars 110b, 110c. The semiconductor pad 90ct extends from the semiconductor photo-active layer 90c, and is formed on the first electrode pad 60ct. The extending portion 100ct extends from the second electrode 100c, and is formed on the semiconductor pad 90ct. To reduce electrical resistance so as to more effectively collect electricity, a laser beam is directed to the conductive belt 110ct and the extending portion 100ct, to melt the conductive belt 110ct and the extending portion 100ct. The extending portion 100ct contacts and is electrically connected to the conductive belt 110ct.

The output terminal 130c is formed by screen-printing a metal paste, then hardening the metal paste by heating. The output terminal 130c extends along the right side of the substrate 30 on the extending portion 100ct. The copper-containing pad 140c having generally rectangular shape is located on one end of the output terminal 130a. The copper-containing pad 140c is formed by screen-printing a copper paste, then hardening the copper paste. Materials of the copper paste may be the same as the above-mentioned copper-containing pad 140a.

A metal foil 150c in a rectangular sheet shape is secured to the copper-containing pad 140c. The metal foil 150c is made of copper, and the entire surface thereof is covered with solder plating. The metal foil 150c is secured in the output terminal region at the right edge in a similar manner as the above-mentioned output terminal region at the left edge.

Figure 7:
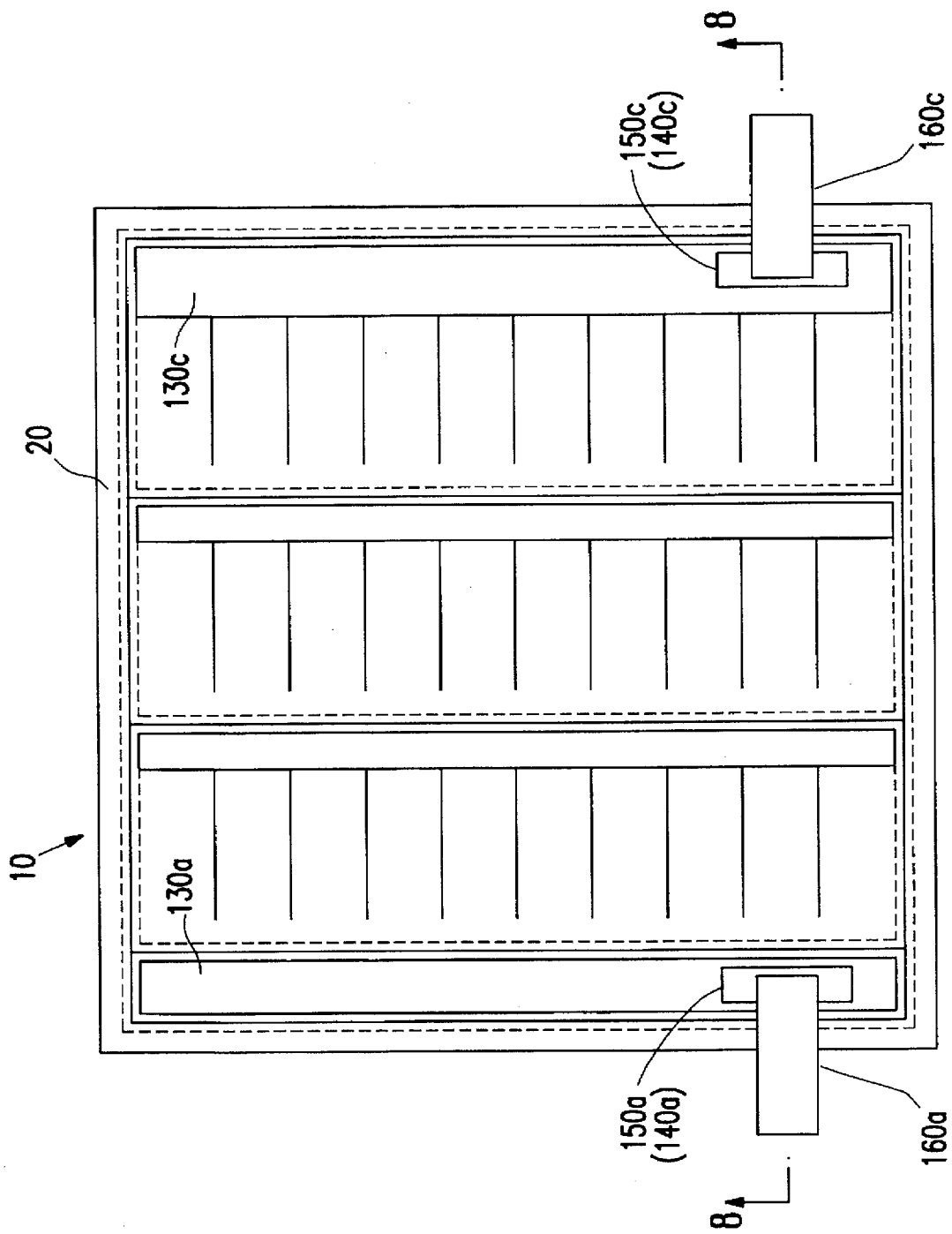
FIG. 7 is a plan view of the semiconductor device in accordance with a first embodiment of the present invention.
Figure 8:
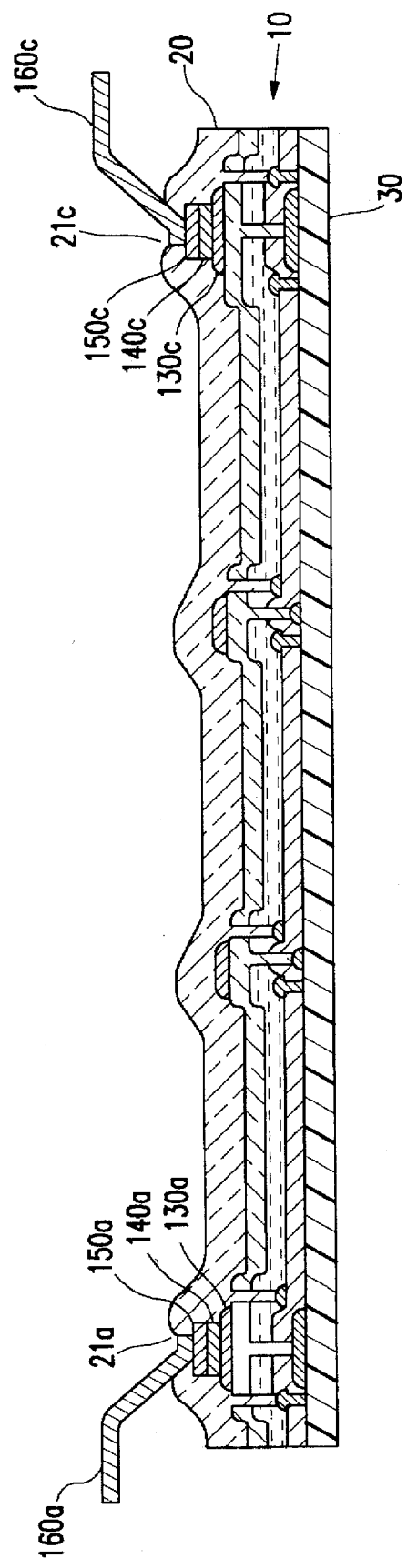
FIG. 8 is a cross-sectional view of the device of FIG. 7 taken along the line 8—8 of FIG. 7.

When the semiconductor element 10 shown in FIGS. 4–6 is completed, the semiconductor device of the first embodiment appears as shown in FIGS. 7–8. As shown therein, a protective film 20 coated with an adhesive layer (not shown) (which is preferably made of an thermoplastic resin) covers the semiconductor element 10. The protective film 20 is preferably about 100–1000 µm in thickness, and is made of a transparent thermoplastic resin, such as, for example, polyethylene terephthalate, or fluorocarbon polymers. The protective film 20 preferably has a higher melting temperature than that of the adhesive layer. When the protective film 20 is laminated on the semiconductor element by a heat roller(not shown), only the adhesive layer melts and secures the protective film 20 to the semiconductor element 10.

The protective film 20 defines openings 21a, 21b over the metal foils 150a, 150c respectively. The openings 21a, 21b are formed in the following manner. A tip of a soldering iron which provides a means for heating is placed on the protective film 20 over the metal foils 150a, 150c, while solder is being melt. Openings 21a, 21b are consequently formed by this heat, and a solder layer (not shown) is formed. Then, lead elements 160a, 160b are soldered onto the metal foils 150a, 150b by the above-mentioned solder layer. Each of the lead elements 160a, 160b are preferably made of copper in the form of a foil, and the entire surface thereof is preferably covered with solder plating.

Figure 1A:
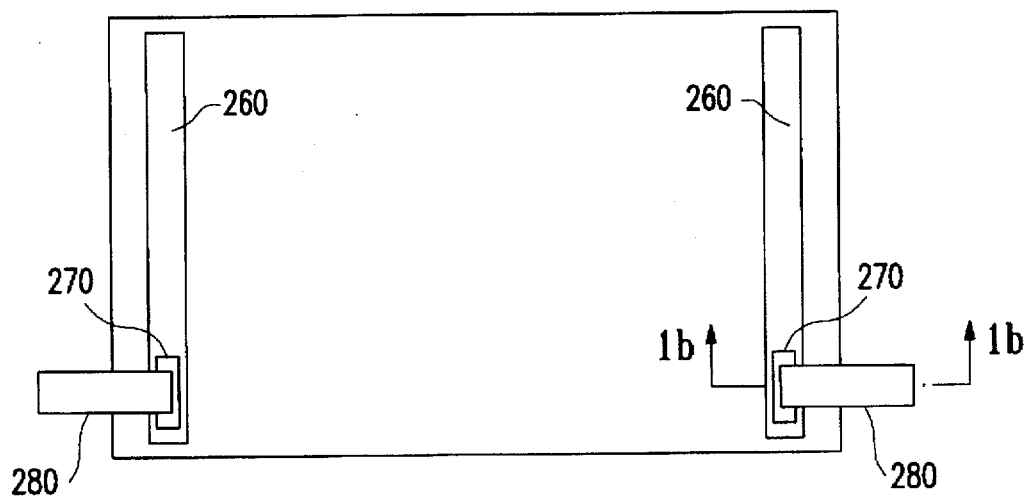
FIG. 1(a) is a plan view of a first prior art semiconductor device.
Figure 1B:
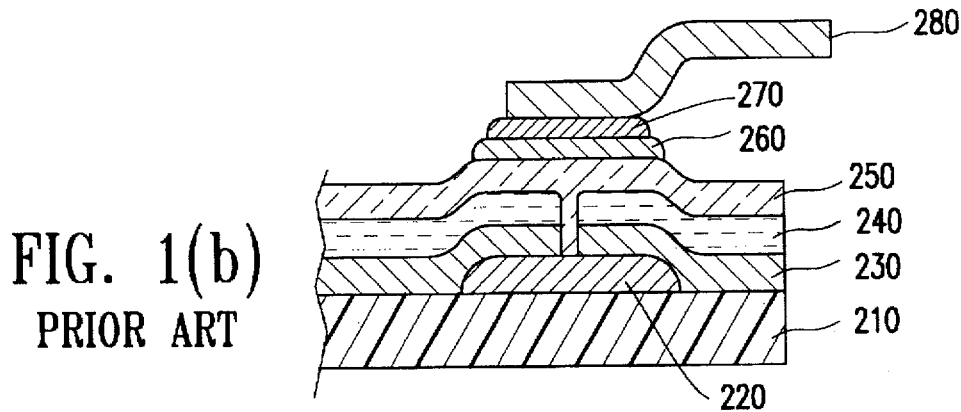
FIG. 1(b) is a cross-sectional view taken along the line 1b—1b of FIG. 1(a).
Figure 2:
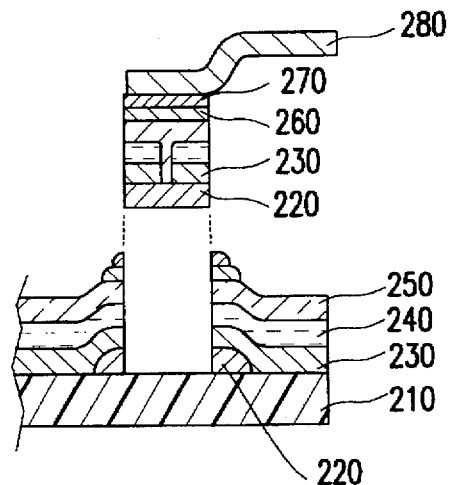
FIG. 2 shows a cross-sectional view of the semiconductor device of FIG. 1(a) in which a lead element is removed.

Tests have been carried out to examine the adhesions of the lead element, in the first embodiment as compared to the lead element in the prior art shown in FIG. 1, in the following manner. The lead element was pulled in a direction normal to the surface of the semiconductor device, and the adhesion strength at which the lead element was removed from the surface was measured.

As a result, in the prior art device, the adhesion was measured at 0.98–2.94N. In the first embodiment of FIGS. 7–8, the adhesion was measured at 14.7–19.6N. This test indicated that a semiconductor device in accordance with the present invention can have a lead element with significantly improved adhesion to the surface.

As mentioned above, the protective film 20 has the openings 21a, 21c at the center of the metal foils 150a, 150b respectively, and covers the semiconductor element 10 including the periphery of the metal foils 150a and 150c. By covering the periphery of the metal foils 150a and 150c, the protective film 20 strongly secures the metals foil 150a and 150c to the semiconductor element 10. Such a structure of the output terminal regions significantly increases the adhesion of the lead element. Furthermore, since the protective film 20 covers and seals the periphery of the metal foil 150a, 150c, moisture advance into the interior of the semiconductor device is significantly retarded. As a result, the moisture resistance of the semiconductor device is substantially improved.

As noted above, the openings 21a, 21c are preferably made by heat, through a process in which the tip of the soldering iron is placed on the protective film 20 over the metal foils 150a, 150c respectively, while the solder is being melted. Such a process is easier than the prior art processes which use a protective film having preformed openings in which the preformed openings generally must be precisely aligned with respect to the output terminals. Another advantage of the openings by heat is that a solder layer is formed on the metal foil at the same time.

In an alternative construction in which the metal foils 150a, 150c are directly secured to the output terminals 130a, 130c respectively, the copper-containing pad can be omitted.

It is appreciated that copper has a high adhesion strength to solder. Therefore when the metal foils 150a, 150c, and the lead elements 160a, 160c are made of copper, contacting areas between the metal foils 150a, 150c and the lead elements 160a, 160c respectively, can be made smaller. This can also reduce the width of the lead elements 160a, 160c.

In the first embodiment, though the contacting area between the metal foil and the lead element is relatively small, the contacting area between the output terminal and the metal foil is preferably larger. This large contact area enables the metal foil to be strongly secured to the output terminal. In addition, by covering the periphery of the metal foil, the protective film permits the metal foil to be strongly affixed to the semiconductor element. In turn, the lead element is strongly secured to the metal foil by soldering through the opening. Consequently, this structure of the output terminal region increases the adhesion of the lead element.

Figure 3A:
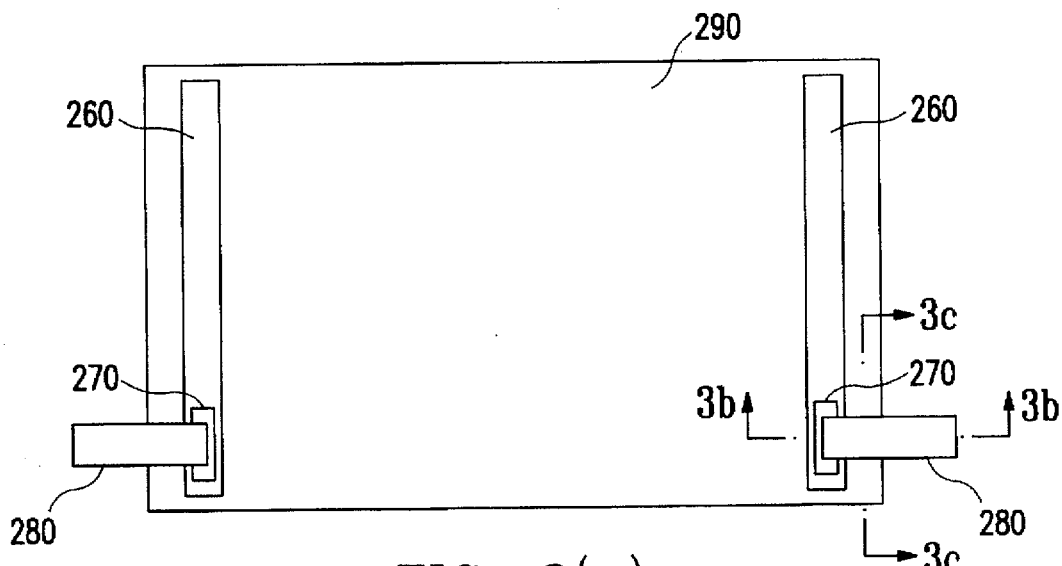
FIG. 3(a) is a plan view of a second prior art semiconductor device.
Figure 3B:
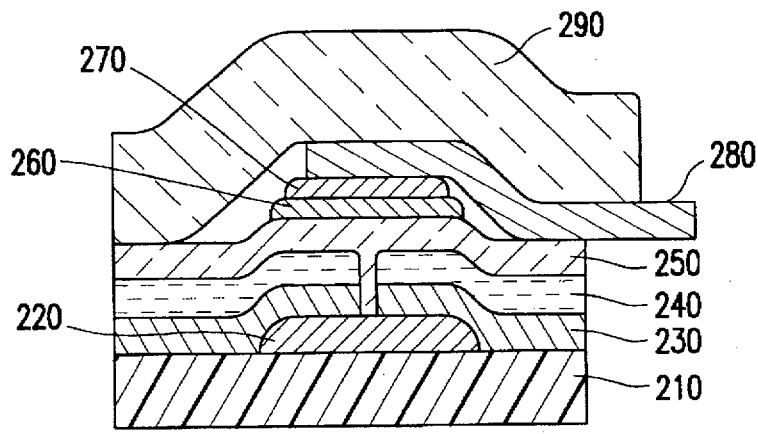
FIG. 3(b) is a cross-sectional view taken along the line 3b—3b FIG. 3(a).
Figure 3C:
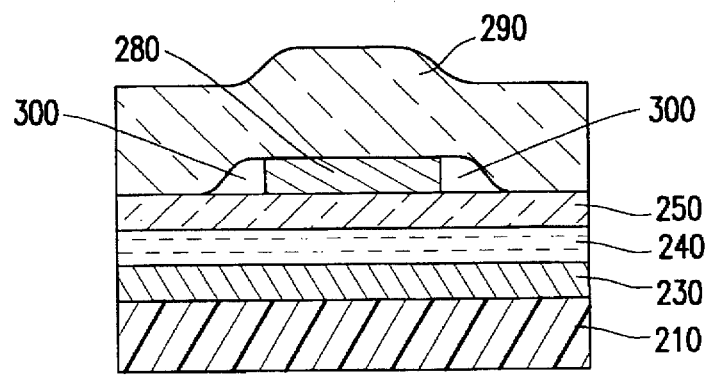
FIG. 3(c) is a cross-sectional view taken along the line 3c—3c of FIG. 3(a).

In the prior art shown in FIG. 3, a plurality of the photovoltaic apparatuses could not readily be formed by dividing from one large substrate. However, in accordance with one feature of the present invention, one large substrate can be readily divided into a plurality of substrates for plural photovoltaic apparatuses, after openings 21a, 21c are made by heat from a soldering iron.

Figure 9:
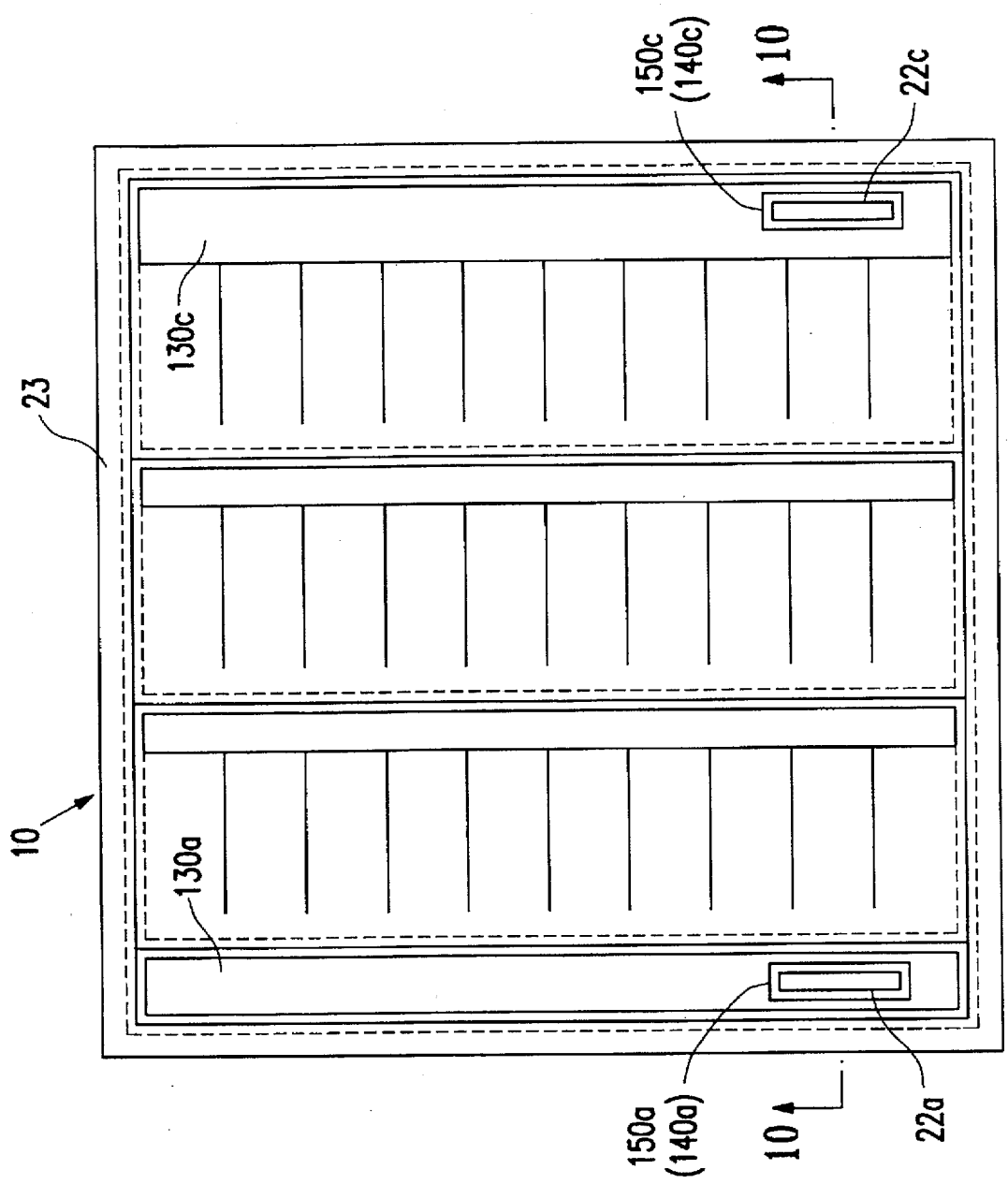
FIG. 9 is a plan view of a semiconductor device in accordance with a second embodiment of the present invention.
Figure 10:
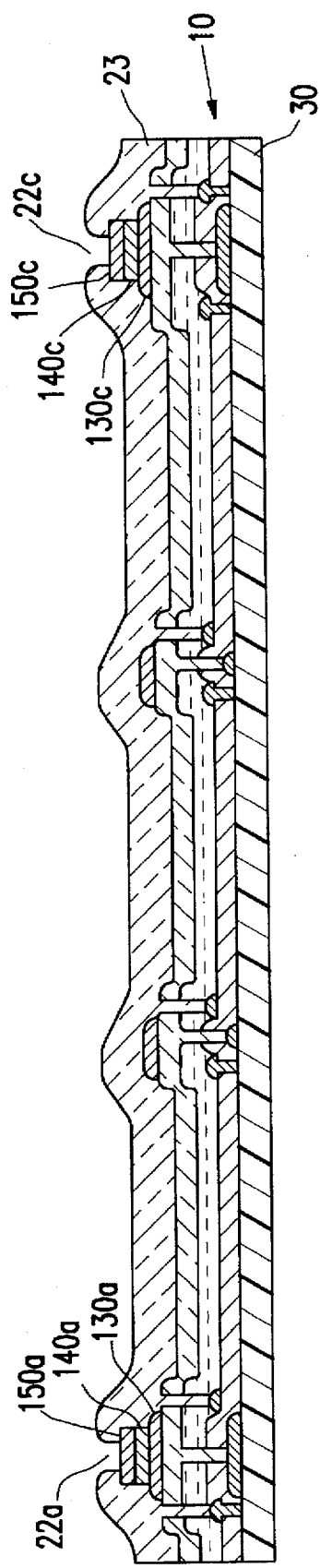
FIG. 10 is a cross-sectional view of the device of FIG. 9 taken along the line 10—10 of FIG. 9.

In the first embodiment, after the protective film 10 is formed on the semiconductor element 10, openings 21a, 21c are made by heat from a soldering iron. However, in a second embodiment shown in FIGS. 9–10, a protective film 23 has rectangular-shaped openings 22a, 22c formed in advance. Therefore the openings 22a, 22c of the protective film 23 are aligned with the output terminals.

In both embodiments, the second electrodes and the protective film are transparent so that light passes through them. However, the first electrode and the substrate may also be transparent so that light can enter through them.

In both embodiments, a protective film is used. However, in stead of the protective film, a protective layer made of a substrate material such as a thermoplastic resin, formed by screen-printing or other suitable method can also be used.

It will, of course, be understood that modifications of the present invention, in its various aspects will be apparent to those skilled in the art, some being apparent only after study and others being matters of routine semiconductor fabrication techniques. As such, the scope of the invention should not be limited by the particular embodiment herein described but should be defined only by the appended claims and equivalents thereof.

What is claimed:

1. A semiconductor device, comprising:
   a semiconductor element;
   an output terminal coupled to the semiconductor element;
   a metal foil having a periphery and having a sheet-like shape by itself of a thickness of about 50–300 m, the metal foil being secured to the output terminal; and
   a laminated protective film having a lower surface by itself, covering the semiconductor element and the periphery of the metal foil by said lower surface, and having an opening surrounded by the periphery of the metal foil, said protective film being formed to strongly secure said metal foil to said output terminal.

2. A semiconductor device according to claim 1, further comprising a lead element secured to the metal foil through the opening.

3. A semiconductor device according to claim 1, wherein the protective layer is made of thermoplastic resin and the opening in the protective layer is made by means of heating.

4. A semiconductor device according to claim 2, wherein a contacting area between the output terminal and the metal foil is larger than a contacting area between the metal foil and the lead element.

5. A semiconductor device according to claim 1, wherein the metal foil has a surface facing the output terminal and a solder plating covering the metal foil surface for securing the metal foil to the output terminal.

6. A semiconductor device according to claim 2, wherein the lead element is a foil.

7. A semiconductor device according to claim 6, wherein the lead element and the metal foil are made of copper.

8. A semiconductor device according to claim 1, further comprising a copper-containing pad disposed between the output terminal and the metal foil, wherein the copper-containing pad is made by hardening a copper paste.

9. A semiconductor device according to claim 1 wherein said protective layer comprises an adhesive layer via which said protective layer is secured to said semiconductor element and to the periphery of the metal foil.

10. A semiconductor device according to claim 9, wherein said protective layer has a thickness of about 100–1000 μm.

11. A semiconductor device according to claim 1, wherein the metal foil has an outer surface for connection to a lead element, the opening surrounded by the periphery of the metal foil is located on the outer surface and the protective layer covers a portion of the outer surface corresponding to the periphery of the metal foil.

12. A photovoltaic device, comprising:

a semiconductor element;

an output terminal coupled to the semiconductor element;

a metal foil having a periphery on an upper surface and having a sheet-like shape by itself of a thickness of about 50–3000 m, the metal foil being secured to the output terminal; and a laminated protective film having a lower surface by itself, covering the semiconductor element and the periphery of the metal foil by said lower surface, and having an opening surrounded by the periphery of the metal foil, paid protective film being formed to strongly secure said metal foil to said output terminal.

13. A photovoltaic device as defined in claim 12, wherein said protective layer is made of a transparent material.

14. A photovoltaic device according to claim 12, wherein the metal foil has an outer surface for connection to a lead element, the opening surrounded by the periphery of the metal foil is located on the outer surface and the protective layer covers a portion of the outer surface corresponding to the periphery of the metal foil.

* * * * *